United States Patent [19]
Groover et al.

[11] Patent Number: 5,637,889
[45] Date of Patent: Jun. 10, 1997

[54] COMPOSITE POWER TRANSISTOR STRUCTURES USING SEMICONDUCTOR MATERIALS WITH DIFFERENT BANDGAPS

[75] Inventors: Robert O. Groover, Dallas, Tex.; Richard A. Blanchard, Los Altos, Calif.

[73] Assignee: SGS-Thomson Microelectronics, Inc., Carrollton, Tex.

[21] Appl. No.: 484,644

[22] Filed: Jun. 7, 1995

Related U.S. Application Data

[63] Continuation-in-part of Ser. No. 397,710, Feb. 28, 1995, Pat. No. 5,591,655.

[51] Int. Cl.$^6$ .................... H01L 31/0328; H01L 29/76
[52] U.S. Cl. .................... 257/192; 257/197; 257/329; 257/335; 257/378; 257/566; 257/616
[58] Field of Search .................... 257/197, 198, 257/273, 329, 335, 378, 401, 566, 616, 192

[56] References Cited

U.S. PATENT DOCUMENTS

| | | | |
|---|---|---|---|
| 4,487,639 | 12/1984 | Lam et al. | 148/175 |
| 4,868,626 | 9/1989 | Nakazato et al. | 257/378 |
| 4,881,119 | 11/1989 | Paxman et al. | 257/378 |
| 4,935,799 | 6/1990 | Mori et al. | 257/378 |
| 5,065,213 | 11/1991 | Frisina et al. | 257/378 |
| 5,118,635 | 6/1992 | Frisina et al. | 437/31 |
| 5,247,200 | 9/1993 | Momose et al. | 257/378 |
| 5,380,670 | 1/1995 | Hagino | 437/31 |
| 5,424,231 | 6/1995 | Yang | 437/40 |

OTHER PUBLICATIONS

Blanchard, "A Power Transistor With an Integrated Thermal Feedback Mechanism," Massachusetts Institute of Technology, (1970).

Vook, et al., "Double-Diffused Graded SiGe-Base Bipolar Transistors," IEEE Transactions on Electron Devices, vol. 41, No. 6, p. 1013 (1994).

King, et al., "Si/Si$_{1-x}$Ge$_x$ Heterojunction Bipolar Transistors Produced by Limited Reaction Processing," IEEE Electron Device Letters, vol. 10, No. 2, p. 52 (1989).

Patton, et al., "75-GHz $f_T$ SiGe-Base Heterojunction Bipolar Transisors," IEEE Electron Device Letters, vol. 11, No. 4, p. 171 (1990).

Kamins, et al., "Small-Geometry, High-Performance, Si/Si$_{1-x}$Ge$_x$ Heterojunction Bipolar Transistors, " IEEE Electron Device Letters, vol. 10, No. 11, p. 503 (1989).

Crabbé, et al., "73-GHz Self-Aligned SiGe-Base Bipolar Transisors with Phosphorus-Doped Polysilicon Emitters, " IEEE Electron Device Letters, vol. 13, No. 5, p. 259 (1992).

Zhang, et al., "Effects of Displaced p-n Junction of Heterojunction Bipolar Transistors," IEEE Transactions on Electron Devices, vol. 39, No. 11, p. 2430 (1992).

Kamins, et al., "High Frequency Si/Si$_{1-x}$Ge$_x$ Heterojunction Bipolar Transistors, " IEDM, p. 647 (1989).

Prinz, et al., "The Effect of Base-Emitter Spacers and Strain-Dependent Densities of States in Si/Si$_{1-x}$Ge$_x$/Si Heterojunction Bipolar Transistors, " IEDM, p. 639 (1989).

Comfort, et al., "Single Crystal Emitter Cap for Epitaxial Si-and SiGe-Base Transistors, " IEDM, p. 857 (1991).

Patton, et al., "SiGe-Base Heterojunction Bipolar Transistors: Physics and Design Issues, " IEDM, p. 13 (1990).

*Primary Examiner*—Minh-Loan Tran
*Attorney, Agent, or Firm*—Theodore E. Galanthay; Lisa K. Jorgenson

[57] ABSTRACT

A power device structure which is formed of two merged device structures: an FET control device is located in a surface layer of narrower-bandgap material, and a blocking device which provides high-voltage-withstand capability is located deeper in the device, in a substrate of wider-bandgap material.

32 Claims, 2 Drawing Sheets

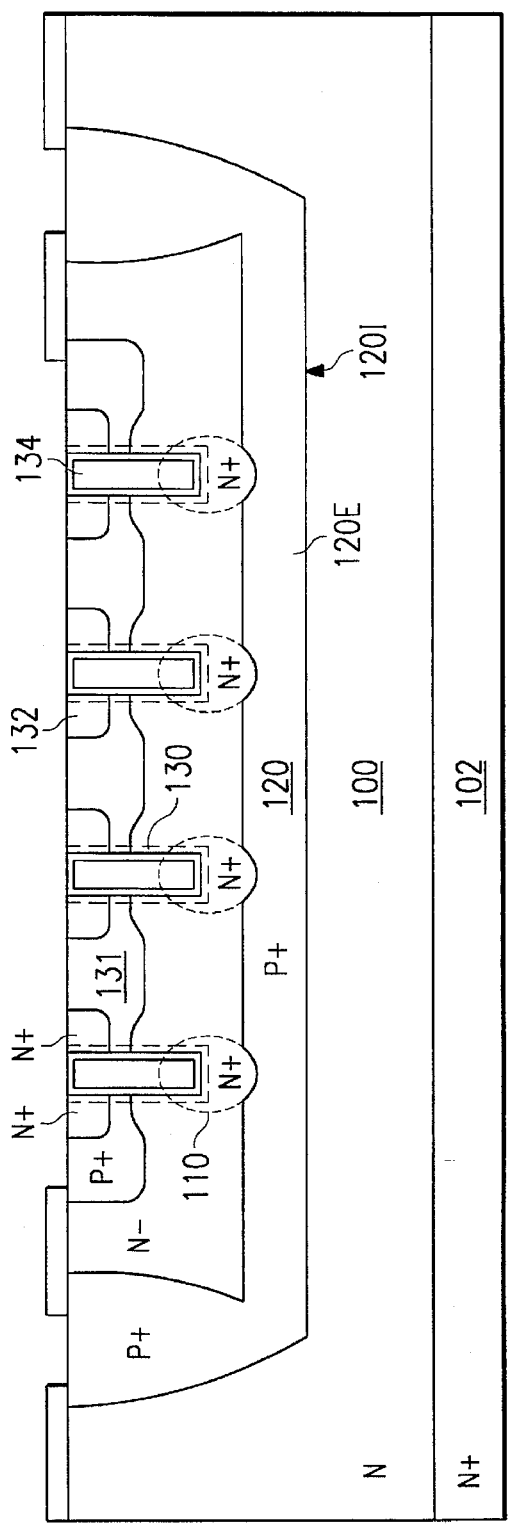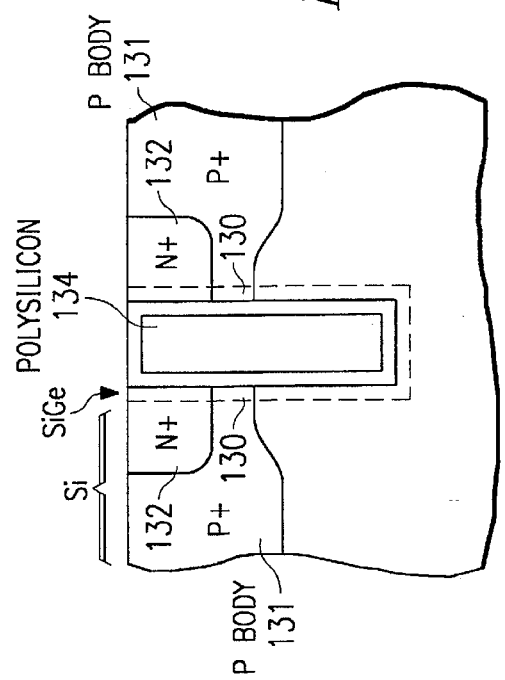

COMPOSITE POWER TRANSISTOR STRUCTURES USING SEMICONDUCTOR MATERIALS WITH DIFFERENT BANDGAPS

CROSS-REFERENCE TO RELATED APPLICATIONS

This application is a continuation-in-part of Ser. No. 08/397,710 filed Feb. 28, 1995 and now U.S. Pat. No. 5,591,655, and therethrough claims priority of earlier cases.

BACKGROUND AND SUMMARY OF THE INVENTION

The present invention relates to power semiconductor device structures for high-voltage and/or high-power operating conditions.

Background: Silicon/Germanium Processing

Germanium is a semiconductor material which has a narrower bandgap, and more nearly equal electron and hole mobilities, than silicon. Much of the earlier transistor work used germanium, but silicon completely replaced germanium in the mainstream of semiconductor development in the 1960s. Thereafter there was little work on germanium materials until around 1990, when a significant amount of effort began to be devoted to development of fabrication processes using silicon/germanium ("SiGe") alloys.

Silicon is superior to germanium in the quality of a grown oxide interface. Moreover, a grown germanium oxide may be water-soluble. However, oxides grown on SiGe alloys with small germanium concentrations (below about 25-30% Ge) largely avoid these problems, and are very nearly as good as the oxide on pure silicon.

One important attraction of silicon/germanium alloys is that they permit the advantages of bandgap engineering to be obtained with conventional silicon processing. See e.g. King et al., "Deposition and properties of low-pressure chemical-vapor deposited polycrystalline silicon-germanium films," 141 J. ELECTROCHEMICAL SOCIETY 2235 (1994); Caymax et al., "Low temperature selective growth of epitaxial Si and $Si_{1-x}Ge_x$ layers from $SiH_4$ and $GeH_4$ in an ultrahigh vacuum, very low pressure chemical vapour deposition reactor: kinetics and possibilities," 241 THIN SOLID FILMS 324-8 (1994); King et al., "Electrical properties of heavily doped polycrystalline silicon-germanium films," 41 IEEE TRANS'NS ELECTRON DEVICES 228 (1994); Johnson et al., "Selective chemical etching of polycrystalline SiGe alloys with respect to Si and $SiO_2$," 21 J. ELECTRONIC MATERIALS 805 (1992); Verdonckt-Vandebroek et at., "SiGe-channel heterojunction p-MOSFET's," 41 IEEE TRANS'NS ELECTRON DEVICES 90 (1994); Caymax et al., "UHV-VLPCVD heteroepitaxial growth of thin SiGe-layers on Si-substrates: influence of pressure on kinetics and on surface-morphology," 32-33 DIFFUSION AND DEFECT DATA B 361 (1993); Hsieh et al., "Ambipolar performances of novel amorphous silicon-germanium alloy thin-film transistors," 32 JAPANESE J. APPLIED PHYSICS PART 2 (Letters) at L1043 (1993); Kesan et al., "High performance 0.25 μm p-MOSFETs with silicon-germanium channels for 300K and 77K operation," 1991 IEDM TECHNICAL DIGEST 25; Verdonckt-Vandebroek et at., "Design issues for SiGe heterojunction FETs," PROC. IEEE/ CORNELL CONFERENCE ON ADVANCED CONCEPTS IN HIGH SPEED SEMICONDUCTOR DEVICES AND CIRCUITS 425 (1991); Verdonckt-Vandebroek et al., "High-mobility modulation-doped SiGe-channel p-MOSFETs," 12 IEEE ELECTRON DEVICE LETTERS 447 (1991); Selvakumar et al., "SiGe-channel n-MOSFET by germanium implantation," 12 IEEE ELECTRON DEVICE LETTERS 444 (1991); Humlicek et al., "Optical spectra of $SixGe_{1-x}$ alloys," 65 J. APPLIED PHYSICS 2827 (1989); Prokes et al., "Formation of epitaxial $Si_{1-x}Ge_x$ films produced by wet oxidation of amorphous SiGe layers deposited on Si(100)," 53 APPLIED PHYSICS LETTERS 2483 (1988); Hamakawa et al., "Recent advances in amorphous silicon solar cells and their technologies," 59-60 J. NON-CRYSTALLINE SOLIDS 1265 (1983). These articles, and all of the references cited in them, are all hereby incorporated by reference.

Stacked Switched Emitter Structures

The present application is a further development of the stacked switched emitter structure invented by Frisina and Ferla, and described in U.S Pat. Nos. 5,065,213 and 5,118, 635. Such devices use a combination of a high-voltage buried-emitter bipolar transistor with a surface transistor which modulates current to the emitter of the buried-emitter bipolar. The base of the buried-emitter bipolar device is held at a constant potential, so the surface device, by modulating vertical current to the emitter of the buried device, modulates the emitter potential of this buried device (which is why such structures are referred to as "switched-emitter" structures). When the surface transistor turns on it pulls down the emitter potential, and when the emitter potential falls significantly below the base potential (by more than a diode drop) the bipolar device turns on. Thus in general the power bipolar device normally provides high-voltage standoff, and the surface device controls the current. Since the buried bipolar device uses bipolar conduction, it can provide a reasonably low on-resistance for a given voltage standoff capability; the surface device can then be optimized to provide such advantages as fast turn-off and high input impedance.

In many embodiments the surface device is located directly above the buried-emitter, which provides a very compact NPNPN merged structure.

A particularly attractive version uses an FET transistor at the surface. This provides a negative temperature coefficient, together with good control characteristics (including voltage control and good turn-off time), while still being a robust device.

Innovative Structures and Methods

The present application describes a new power transistor device structure. This device is a composite device, which includes an FET control device in combination with a second device which provides high-voltage withstand. (The composite device may be e.g. a switched-emitter structure or may be a VDMOS transistor, which can be regarded as a lateral DMOS transistor combined with a vertical JFET.) The channel of the control device is located in a reduced-bandgap semiconductor material, e.g. SiGe; this provides optimal current density (due to the better carrier mobility of such material). The second device is located in a different semiconductor material (e.g. Si), which has the full bandgap and hence is better suited to providing optimal high-voltage withstand.

This composite structure separately optimizes the characteristics of the surface device and the buried device. SiGe alloys are a relatively attractive way to build such structures, since the good surface interface of Si can be combined with bandgap variation due to variation in the Ge fraction.

Most of the published work on Si/SiGe heterojunctions has focussed on the use of heterojunctions at the emitter/base junction of a bipolar transistor. In a heterojunction bipolar transistor ("HBT"), the carrier potential introduced by this heterojunction provides increased emitter injection efficiency, which is very desirable for achieving high-speed bipolar devices. However, this consideration is far less important in power devices, and the teachings summarized above are not related to the conventional teachings regarding HBTs.

Si and the SiGe alloys all have the same crystal structure, but variation in the germanium fraction also creates a change in the lattice constant. A small amount of lattice mismatch can be tolerated, but lattice mismatch is a parameter which must be minimized (or at least kept within an acceptable range). Thus it is preferable to use a relatively small lattice mismatch, as discussed below.

A first embodiment uses Si (or a wider-bandgap SiGe alloy) for the buried device, and a narrower-bandgap SiGe alloy for the surface device. This permits the maximum current density of the surface device to be increased. The SiGe surface portion may be implanted and annealed, or may be grown by a brief epitaxial growth step.

An alternative embodiment uses trench transistors for the control device, and provides a high-mobility channel region for these transistors by performing a short epitaxial growth step onto the sidewalls of the trench before growing the gate oxide for the trench transistors. (This epitaxy step can be masked, to provide trench transistor channels only, or to provide trench transistor and PMOS channels only, or can be performed on all active device areas.)

In many embodiments the high-mobility material is very shallow, only deep enough to provide a high-mobility channel region in an accumulation device. This simplifies the processing and reduces the strain (and generation of defects) due to lattice mismatch. Moreover, this makes it easy to also provide surface semiconductor portions which do not have the increased mobility.

The composite structure can be integrated with conventional CMOS devices. A side benefit in this case is that the enhanced-mobility material improves the drive capability of PMOS devices, permitting greater symmetry in device operation.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3 shows a third sample device structure according to the present invention, and FIG. 3A shows a detail view of the trench transistor in FIG. 3.

DETAILED DESCRIPTION OF THE PREFERRED EMBODIMENTS

The numerous innovative teachings of the present application will be described with particular reference to the presently preferred embodiment (by way of example, and not of limitation), in which:

First Device Embodiment: VDMOS

Figure 1:
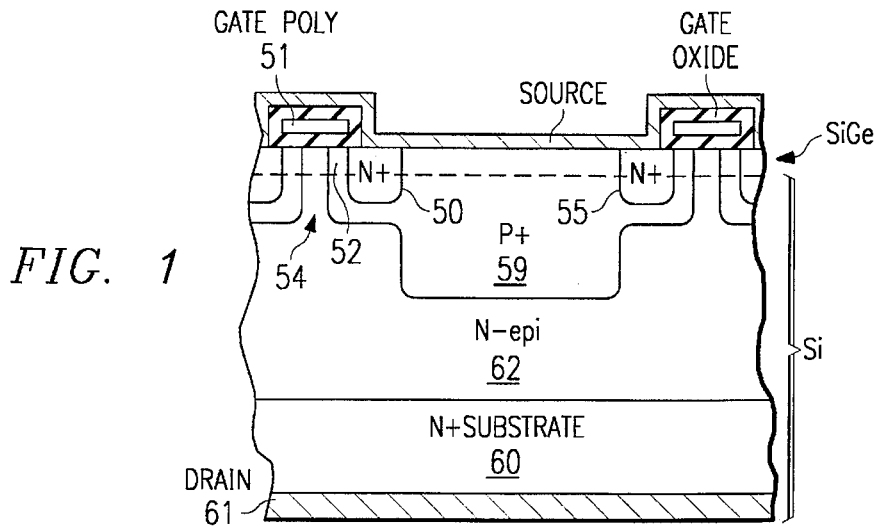
FIG. 1 shows a first sample device structure according to the present invent. This is VDMOS, in which the mobility of the channel regions, but not of the regions where JFET pinchoff occurs, has been increased.

FIG. 1 shows a first sample device structure according to the present invention. This is a VDMOS, in which the mobility of the channel regions 52, but not of the regions 54 where JFET pinchoff occurs, has been increased. The dashed horizontal line indicates the approximate boundary between the $SiGe_{.1}$ material, in the presently preferred embodiment, and the pure silicon. However, a too-shallow boundary makes process control more difficult (especially in relation to control of oxide growth). This structure operates conventionally (except that the current density is increased); i.e. the potential of insulated gate 51 controllably pulls the channel 52 into accumulation, and thereby permits electrons to flow from source 50 down through the N-type epitaxial layer 62 and N-type substrate 60 to a backside drain contact 61. The channel 52 is formed by a surface portion of the P-type body diffusion 52. Deep body diffusion 59 provides added JFET gating for high-voltage withstand.

Second Device Embodiment: Switched-Emitter with DMOS Control Device

Figure 2:
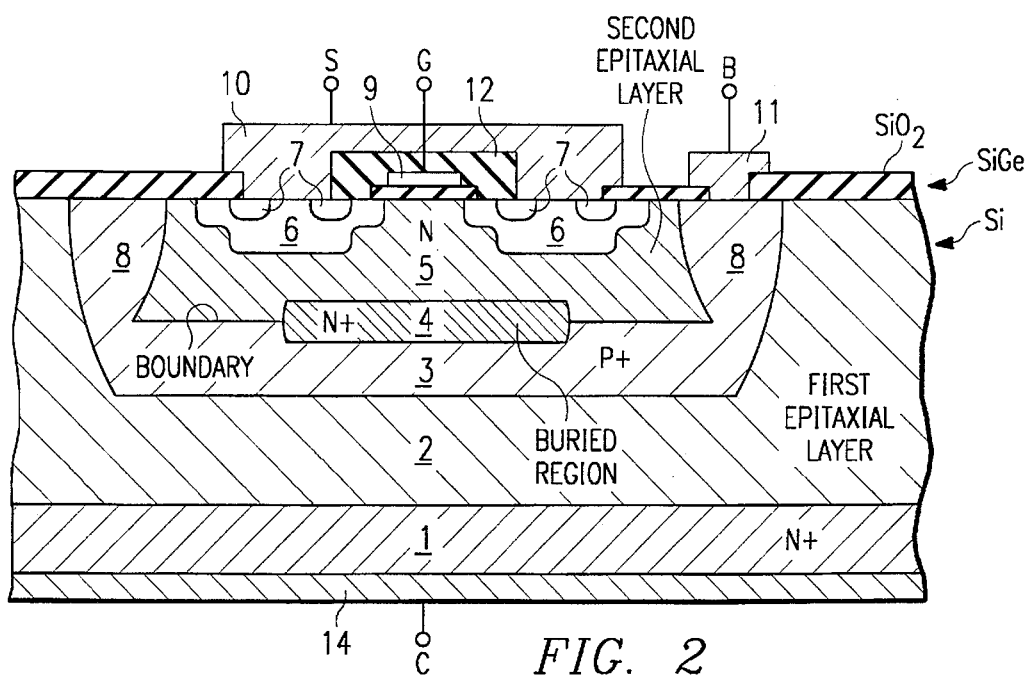
FIG. 2 shows a second sample device structure according to the present invention, in which a surface DMOS, with enhanced mobility, drives the emitter of a buried bipolar transistor which provides high-voltage withstand.

FIG. 2 shows a second sample device structure according to the present invention, in which a surface DMOS, with enhanced mobility, drives the emitter of a buried bipolar transistor which provides high-voltage withstand. In the illustrated example the surface DMOS is a VDMOS, but of course this can be varied. The dashed line indicates the approximate boundary between the $SiGe_{.1}$ material, in the presently preferred embodiment, and the pure silicon. In this embodiment this boundary is indicated as lying below the source junction, but alternatively this could be as shallow as the source junction depth, or even shallower. (Ultimately the relevant depth is the depth of the accumulation region when the device is fully turned on, and some benefit will still be obtained if bandgap gradation occurs within this depth.)

In this structure, the connections to external terminals C (collector), B (base), S (source) and G (gate) are indicated. The insulating layer 12 separates the gate 9 from the source metallization 10. Regions 1, 2, 3 and 4 of the figure constitute, respectively, the collector, the base and the emitter of a bipolar transistor, while region 5 constitutes the drain of the MOS.

Switched-emitter devices, like IGBTs, preferably use clamping diodes when used with inductive loads.

Figure 2A:
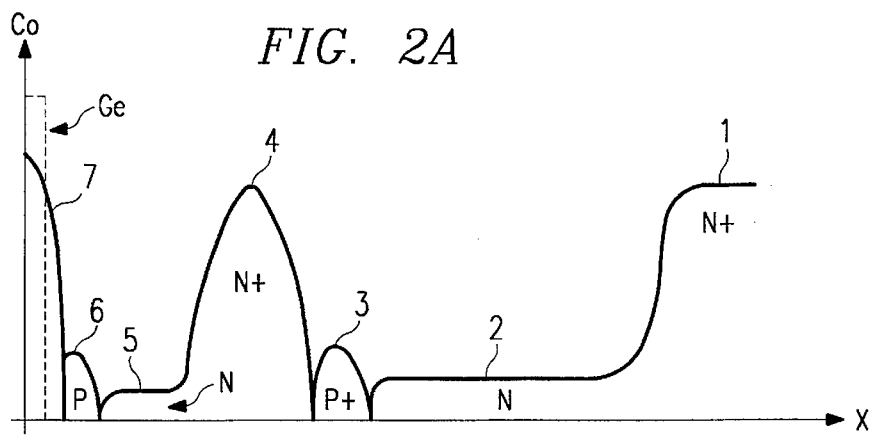
FIG. 2A shows a sample doping profile for a vertical line through the structure of FIG. 2.

FIG. 2A shows a sample doping profile for a vertical line through the structure of FIG. 2. Germanium fraction is shown with a dotted line, since germanium is not a dopant (strictly speaking). The lateral dimensions of this figure are not to scale, but this figure does give some indication of relative dopant levels.

Third Device Embodiment: Switched-Emitter with Trench Transistor Control Device FIG. 3 shows a third sample device structure according to the present invention. This is another switched-emitter structure, but in this case the control device is a trench transistor with enhanced mobility. Due to the scale required, this drawing does not explicitly show the bandgap variation, but this is shown in the detail view of FIG. 3A.

The n+ emitter portions 110, in the presently preferred embodiment, have a pitch in the range of 10–15 μm and a minimum width of e.g. 3–4 μm. (The width is less than half the pitch in order to avoid current crowding between adjacent emitters.) The pitch, in the presently preferred embodiment, is limited by the n+ pitch rather than the trench pitch. (Minimum geometries for buried layers are typically larger than those of overlying structures.)

The dopant density (Q) for the buried layers is typically in the range of 5E14–5E16 $cm^{-2}$ for each (specifically e.g. $5 \times 10^{15}$ $cm^{-2}$ for the P-type and $2 \times 10^{16}$ $cm^{-2}$ for the N-type). Many bipolar structures use a heavier doping for the N-type buried layer (and this may be preferable in some implementations of the disclosed structure), but this is not strictly necessary for the practice of the present invention (emitter injection efficiency is not particularly a concern). The P-type doping density is preferably selected to provide a low sheet resistance in the extrinsic base 120E while retaining base width control; the N-type dopant density is preferably selected to provide counterdoping of the P-type dopants, and to provide a heavier doping on the emitter side of the emitter/base junction.

Boron is preferred for the p-type buried layer 120. (The greater diffusivity of Boron, as opposed to gallium, would provide greater counterdoping, hence a greater ratio of extrinsic base width to intrinsic base width.) A slow diffusing dopant (As or Sb) is preferred for the n-type buried layer, but phosphorus can also be used.

The length of the channel 130 of the trench FET, in the presently preferred embodiment, is selected to withstand only a moderate voltage (e.g. about 20 V, which implies a channel length of about 0.5 to 1 μm with typical epitaxial layer doping levels. The epitaxial layer thickness can accordingly be e.g. 5 to 10 microns. The channel 130 is provided by the portion of p-type body diffusion 131 which is nearest the trench (and hence can be gated by trench gate 134).

The source 132 is shallow and doped N+.

The gate 134 of the trench FET is, e.g., N+ polysilicon.

A clamp diode is preferably used to protect the switched-emitter structure when inductive loads must be driven.

The minimum intrinsic base thickness in this type of structure is selected in accordance with the desired gain and ruggedness, but is typically in the range of 1–4 μm. Larger base widths imply lower gain but greater ruggedness.

The bipolar transistor is preferably be a fairly low-gain device, e.g. beta of 20–100. (The beta is controlled by selecting the base width; lower base widths produce higher gain, but transistors with lower beta are typically more rugged.)

Typical operating voltages on this structure may be, e.g., 3 V constant base voltage (optionally fed through a load impedance); 0 V source voltage on the control device; gate voltage switched between e.g. 0 V and e.g. 10 V; collector voltage 500 V. Of course a wide variety of different operating voltages can be specified, with or without modifications to optimize the device structure, but this example will help to illustrate the advantages of the disclosed structure.

As seen in the detail view of FIG. 3A, a region of SiGe alloy exists along the walls of the trench, and thus the channel regions 130 are located in a region of higher mobility.

First Process Embodiment: Shallow Epitaxial Growth

There are several process options in constructing the innovative devices. The simplest approach is simply to epitaxially grow a thin layer of SiGe, e.g. $SiGe_{.1}$ to a thickness in the range of 100–5000 Å (preferably e.g. 1000 Å). This is preferably performed on a naked wafer, but optionally can be performed after a LOCOS-patterned field oxide has been grown (since the wider-bandgap material is preferred under the field oxide). Optionally n-wells and p-wells, if desired, can also be formed before the epitaxial growth.

(Optionally a brief silicon epitaxy can be performed after the SiGe epitaxy (e.g. to 300 Å), to facilitate the subsequent growth of a gate oxide which is predominantly $SiO_2$. Depending on the thickness of this overgrowth a reverse bandgap gradation may occur near the surface, but this can be tolerated as long as lower-bandgap portions dominate the depth of the channel accumulation layer.)

After these initial steps, the rest of the process uses normal transistor fabrication steps, for whatever mix of devices is desired, which are entirely conventional and well-known.

Second Process Embodiment: Deep Epitaxial Growth

This embodiment is generally less preferable, due to greater process complexity and defect density. However, this may be preferred for other reasons. Also, this is the most straightforward way (although not contemplated as the most preferable) to construct a switched-emitter device with trench FET control devices. In this case the SiGe epitaxy would be made thick enough to extend down to the drain of the trench transistor, e.g. 2 μm thick.

Third Process Embodiment: Sidewall Epitaxial Growth

This is a more preferable way to fabricate device embodiments with a trench control transistor. In this process embodiment a short SiGe epitaxial growth step, as described in the first process embodiment above, is performed after the trenches have already been etched. (The epitaxial growth thickness is less than ¼ of the ultimate minimum trench width, and more preferably less than ¹⁄₁₀ thereof.) This provides a high current density in the trench FETs (which is where the limit on current density arises), without requiring a long epitaxial growth step. This process also provides good compatibility with use of the epitaxial layer for other devices, e.g. CMOS.

Fourth Process Embodiment: Implantation and Annealing

In this embodiment an implant of Ge is performed with a dose in the range of e.g. 5E17 to 1E19 $cm^{-2}$ and an energy selected to provide a stopping distance in the range of 100 to 500 Å. After annealing this provides a lower-bandgap surface portion as desired.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, it is not at all necessary to use a pure silicon substrate: the substrate may itself be a low-alloy (wider-bandgap) SiGe alloy while the surface layer is a higher-alloy (lower-bandgap) SiGe alloy.

For another example, it is not strictly necessary to use only the Si/SiGe alloy spectrum to provide the desired bandgap engineering capability. The above teachings can optionally also be adapted to Si/SiC alloys or to ternary semiconductors such as GeSiC alloys.

For another example, the capability for bandgap engineering can also be used for other portions of the device structure. For example, in the switched-emitter embodiments the high-mobility control device channel, as described above, can optionally be combined with a heterojunction at the level of the buried emitter/base junction, to provide improved emitter injection efficiency in the buried device. This narrow/wide/narrow bandgap structure is not particularly preferred, but can be implemented if desired (e.g. by growing a silicon epi layer on a $SiGe_{.1}$ substrate).

What is claimed is:

1. A solid-state electronic device structure, comprising:
   a first transistor portion having current-control portions thereof formed in a first semiconductor material; and
   a second transistor portion which has current-control portions thereof formed in a second semiconductor material which has a wider bandgap than said first semiconductor material;
   said first and second transistor portions being connected in series to provide a combined power device structure in which said first transistor portion regulates current while said second transistor portion provides high-voltage withstand capability.

2. The composite device structure of claim 1, wherein said first semiconductor material is SiGe.

3. The composite device structure of claim 1, wherein said first semiconductor material is SiGe, and said second semiconductor material is Si.

4. The composite device structure of claim 1, wherein said first and second semiconductor materials are both SiGe alloys, and have different Ge fractions.

5. The composite device structure of claim 1, wherein said second semiconductor material is Si.

6. The composite device structure of claim 1, wherein said first and second transistor portions form a VDMOS composite device.

7. The composite device structure of claim 1, wherein said first transistor portion is a trench transistor.

8. The composite device structure of claim 1, wherein said first and second transistor portions form a switched-emitter composite device.

9. A solid-state electronic composite device structure, comprising:
   a first field-effect transistor portion having a channel thereof formed in a first semiconductor material; and
   a second bipolar transistor portion which has a base portion thereof formed in a second semiconductor material which has a wider bandgap than said first semiconductor material;
   said first and second transistor portions being connected in series to provide a composite power device structure in which said first transistor portion regulates current while said second transistor portion provides high-voltage withstand capability.

10. The composite device structure of claim 9, wherein said first semiconductor material is SiGe.

11. The composite device structure of claim 9, wherein said first semiconductor material is SiGe, and said second semiconductor material is Si.

12. The composite device structure of claim 9, wherein said first and second semiconductor materials are both SiGe alloys, and have different Ge fractions.

13. The composite device structure of claim 9, wherein said second semiconductor material is Si.

14. The composite device structure of claim 9, wherein said first and second transistor portions form a VDMOS composite device.

15. The composite device structure of claim 9, wherein said first transistor portion is a trench transistor.

16. The composite device structure of claim 9, wherein said first and second transistor portions form a switched-emitter composite device.

17. A solid-state electronic composite device structure, comprising:
   a first transistor portion having current-control portions thereof formed in a first semiconductor material, said current-control portions controlling current flow between upper and lower first-conductivity-type diffusions of said first transistor portion; and
   a second transistor portion which has current-control portions thereof formed in a second semiconductor material which has a wider bandgap than said first semiconductor material; said current control portions of said second transistor portion controlling current flow between upper and lower first-conductivity-type diffusions of said second transistor portion;
   said lower first-conductivity-type diffusion of said first transistor portion being merged with said upper first-conductivity-type diffusion of said second transistor portion, and said first and second transistor portions being thereby connected in series to provide a composite power device structure in which said first transistor portion regulates current while said second transistor portion provides high-voltage withstand capability.

18. The composite device structure of claim 17, wherein said first semiconductor material is SiGe.

19. The composite device structure of claim 17, wherein said first semiconductor material is SiGe, and said second semiconductor material is Si.

20. The composite device structure of claim 17, wherein said first and second semiconductor materials are both SiGe alloys, and have different Ge fractions.

21. The composite device structure of claim 17, wherein said second semiconductor material is Si.

22. The composite device structure of claim 17, wherein said first and second transistor portions form a VDMOS composite device.

23. The composite device structure of claim 17, wherein said first transistor portion is a trench transistor.

24. The composite device structure of claim 17, wherein said first and second transistor portions form a switched-emitter composite device.

25. A solid-state electronic composite device structure, comprising:
   a first transistor portion having current-control portions thereof formed in a first semiconductor material;
   a second transistor portion which has current-control portions thereof formed in a second semiconductor material which has a wider bandgap than said first semiconductor material; said current control portions of said second transistor portion controlling bipolar current flow in a predominantly vertical direction;
   said first semiconductor material being epitaxially overlaid on said second semiconductor material;
   said first and second transistor portions being connected in series to provide a composite power device structure in which said first transistor portion regulates current while said second transistor portion provides high-voltage withstand capability.

26. The composite device structure of claim 25, wherein said first semiconductor material is SiGe.

27. The composite device structure of claim 25, wherein said first semiconductor material is SiGe, and said second semiconductor material is Si.

28. The composite device structure of claim 25, wherein said first and second semiconductor materials are both SiGe alloys, and have different Ge fractions.

29. The composite device structure of claim 25, wherein said second semiconductor material is Si.

30. The composite device structure of claim 25, wherein said first and second transistor portions form a VDMOS composite device.

31. The composite device structure of claim 25, wherein said first transistor portion is a trench transistor.

32. The composite device structure of claim 25, wherein said first and second transistor portions form a switched-emitter composite device.

* * * * *